US012593459B2

(12) United States Patent
Su et al.

(10) Patent No.: US 12,593,459 B2
(45) Date of Patent: Mar. 31, 2026

(54) BACKSIDE MEMORY INTEGRATION

(71) Applicant: Taiwan Semiconductor Manufacturing Company, Ltd., Hsinchu (TW)

(72) Inventors: Hsin-Wen Su, Yunlin County (TW); Jui-Lin Chen, Taipei City (TW); Shih-Hao Lin, Hsinchu City (TW); Ming-Yen Chuang, Hsinchu City (TW); Chenchen Jacob Wang, Hsinchu (TW); Lien-Jung Hung, Taipei (TW); Ping-Wei Wang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 394 days.

(21) Appl. No.: 17/403,629

(22) Filed: Aug. 16, 2021

(65) Prior Publication Data

US 2022/0352256 A1      Nov. 3, 2022

Related U.S. Application Data

(60) Provisional application No. 63/180,863, filed on Apr. 28, 2021.

(51) Int. Cl.
H10D 30/67 (2025.01)
H10B 61/00 (2023.01)
(Continued)

(52) U.S. Cl.
CPC ........... H10B 61/22 (2023.02); H10D 30/031 (2025.01); H10D 30/6713 (2025.01); H10D 30/6735 (2025.01); H10D 30/6757 (2025.01); H10D 62/118 (2025.01); H10N 50/01 (2023.02); H10N 50/80 (2023.02)

(58) Field of Classification Search
CPC .... H10N 50/80; H10N 50/01; H01L 29/0665; H01L 29/42392; H01L 29/66742; H01L 29/78618; H01L 29/78696; H01L 29/7869; H10B 61/22; H10D 30/6757; H10D 62/118; H10D 30/6713; H10D 30/6735; H10D 30/501509; H10D 30/017; H10D 30/019–0198; H10D 30/0312;
(Continued)

(56) References Cited

U.S. PATENT DOCUMENTS 9,780,210 B1 * 10/2017 Goktepeli ............... H01L 21/84
2014/0175580 A1 * 6/2014 Chen ...................... H10N 50/01
257/421
(Continued)

*Primary Examiner* — Matthew C Landau
*Assistant Examiner* — David W Ward
(74) *Attorney, Agent, or Firm* — HAYNES AND BOONE, LLP

(57) ABSTRACT

Semiconductor structures and methods of the forming the same are provided. A semiconductor structure includes a source feature and a drain feature, an active region between the source feature and the drain feature, a gate structure over the active region, a frontside interconnect structure disposed over the source feature, the drain feature, and the gate structure, a backside interconnect structure disposed below the source feature, the drain feature, and the gate structure, and a storage element disposed in the backside interconnect structure.

20 Claims, 15 Drawing Sheets

(51) Int. Cl.

| | | |
|---|---|---|
| *H10D 30/01* | (2025.01) | |
| *H10D 62/10* | (2025.01) | |
| *H10N 50/01* | (2023.01) | |
| *H10N 50/80* | (2023.01) | |

(58) Field of Classification Search
CPC ............. H10D 30/0318; H10D 30/031; H10D
30/501–509; H10D 30/674
See application file for complete search history.

(56) References Cited

U.S. PATENT DOCUMENTS

| | | | |
|---|---|---|---|
| 2019/0097592 A1* | 3/2019 | Goktepeli | .............. H10D 84/83 |
| 2019/0386062 A1* | 12/2019 | Wang | ................... H10N 52/101 |
| 2020/0136027 A1 | 4/2020 | Wu et al. | |
| 2020/0294998 A1* | 9/2020 | Lilak | ..................... H01L 23/535 |
| 2020/0357895 A1* | 11/2020 | Cheng | .............. H01L 21/31116 |
| 2021/0202574 A1 | 7/2021 | Chuang et al. | |
| 2021/0217951 A1 | 7/2021 | Yang et al. | |
| 2021/0242322 A1* | 8/2021 | Liang | ................... H01L 29/785 |
| 2021/0335690 A1* | 10/2021 | Huang | .............. H10D 30/6735 |
| 2021/0336019 A1* | 10/2021 | Su | ...................... H10D 30/6735 |
| 2021/0358891 A1* | 11/2021 | Chuang | ................... H01L 25/18 |
| 2021/0384227 A1* | 12/2021 | Yang | ................... H01L 29/0847 |
| 2021/0399099 A1* | 12/2021 | Chu | ..................... H10D 30/031 |
| 2022/0165856 A1* | 5/2022 | Yu | ..................... H01L 21/76831 |
| 2022/0190159 A1* | 6/2022 | Paul | ................... H10D 30/014 |
| 2022/0293730 A1* | 9/2022 | Kim | ................... H10D 62/151 |

* cited by examiner

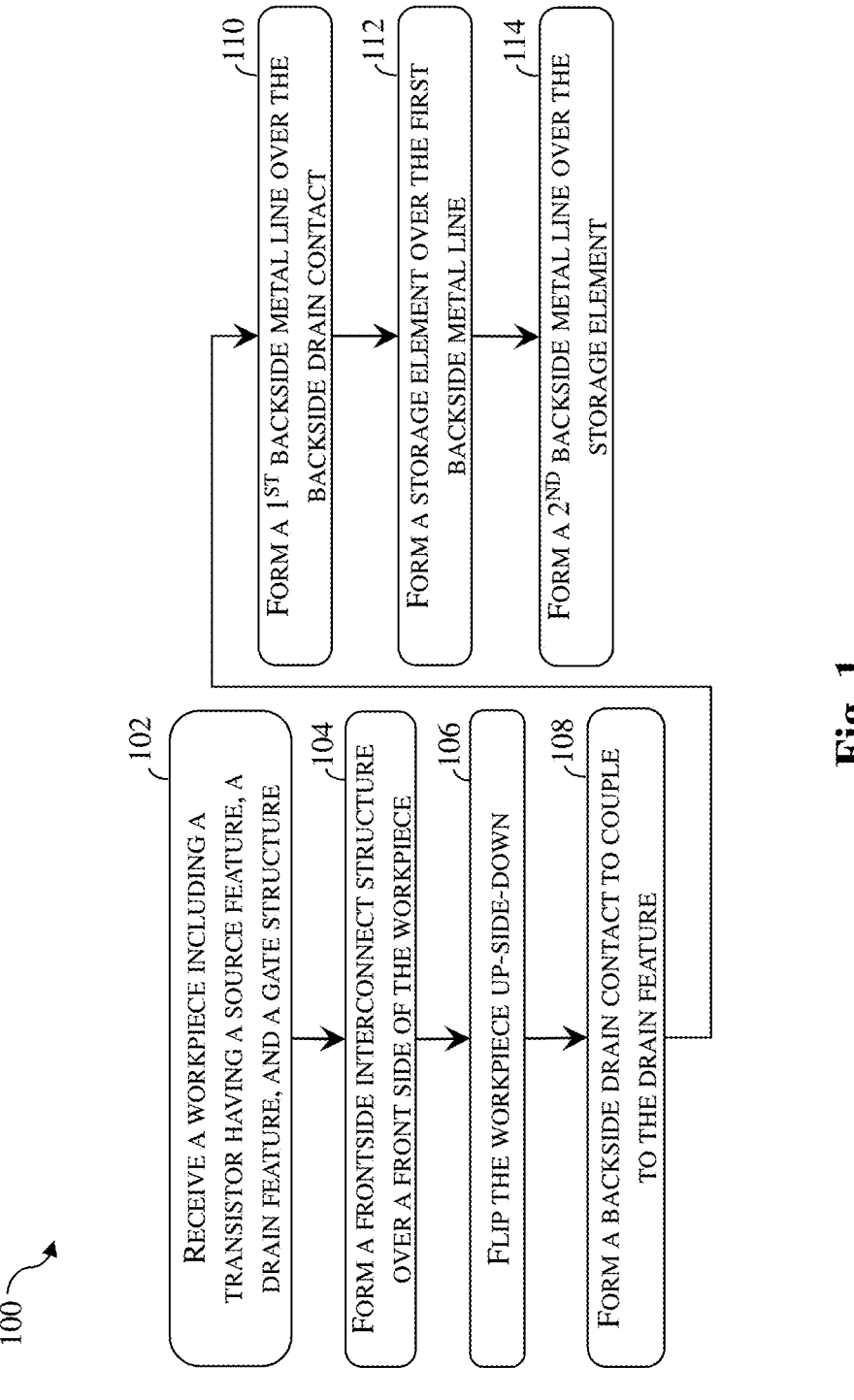

100

RECEIVE A WORKPIECE INCLUDING A TRANSISTOR HAVING A SOURCE FEATURE, A DRAIN FEATURE, AND A GATE STRUCTURE — 102

FORM A FRONTSIDE INTERCONNECT STRUCTURE OVER A FRONT SIDE OF THE WORKPIECE — 104

FLIP THE WORKPIECE UP-SIDE-DOWN — 106

FORM A BACKSIDE DRAIN CONTACT TO COUPLE TO THE DRAIN FEATURE — 108

FORM A 1ST BACKSIDE METAL LINE OVER THE BACKSIDE DRAIN CONTACT — 110

FORM A STORAGE ELEMENT OVER THE FIRST BACKSIDE METAL LINE — 112

FORM A 2ND BACKSIDE METAL LINE OVER THE STORAGE ELEMENT — 114

Fig. 1

BACKSIDE MEMORY INTEGRATION

PRIORITY DATA

The present application claims the benefit of U.S. Provisional Application No. 63/180,863, entitled "Backside Memory Integration," filed Apr. 28, 2021, herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Modern-day electronic devices contain volatile or non-volatile electronic memory to store data. Volatile memory stores data when it is powered, while non-volatile memory is able to retain stored data when power is removed. Magneto-resistive random-access memory (MRAM) is one promising candidate for a next generation non-volatile memory technology. MRAM devices may be integrated in the frontside interconnect structure disposed over a device substrate. While existing MRAM integration schemes are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 illustrates a flow chart of a method for forming a semiconductor structure having a storage element in a backside interconnect structure, according to one or more aspects of the present disclosure.

DETAILED DESCRIPTION

Figure 2:
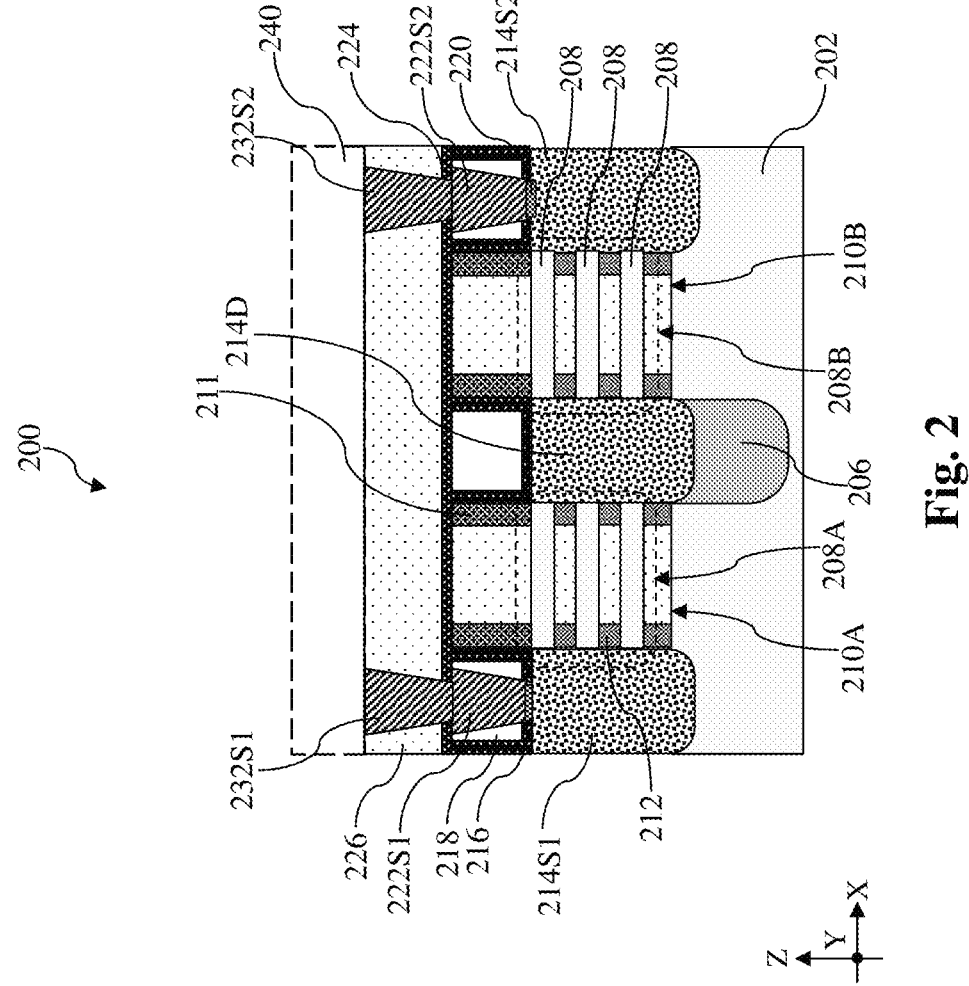
FIGS. 2-9 illustrate fragmentary cross-sectional views of a workpiece during a fabrication process according to the method of FIG. 1, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

A bit cell of a Magneto-resistive random-access memory (MRAM) device includes a magnetic tunnel junction (MTJ) structure vertically arranged between two electrodes. The MTJ structure includes a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned magnetic layer. The parallel configuration provides for a low resistance state that digitally stores data as a first bit value (e.g., a logical "0"). The anti-parallel configuration provides for a high resistance state that digitally stores data as a second bit value (e.g., a logical "1"). The switching between the two configurations provides two magnetic states of the MTJ structure. The magnetic state of the MTJ structure is set by application of a write current of appropriate amplitude and polarity, or read out by application of a read current to apply a voltage to a sense circuit. Depending on the resistance states of the bit cell, the voltage may be higher or lower.

A bit cell of an MRAM device includes a top electrode over the MTJ structure and a bottom electrode below the MTJ structure. In some implementations, the bit cell of an MRAM is controlled by a driving transistor disposed at the front-end-of-line (FEOL) level. The driving transistor includes a source feature, a drain feature, an active region between the source feature and the drain feature and a gate structure over the active region. When the bit cell is disposed in a frontside interconnect structure over the driving transistor, the top electrode is coupled to a bit line (BL) and the bottom electrode is coupled to one of the drain feature of the driving transistor through a series of island-like metal features and contact vias. A source line (SL) is electrically coupled to the source feature of the driving transistor. The gate structure of the driving transistor is coupled to a word line (WL). When the word line (WL) is selected by application of an enabling voltage, the driving transistor is turned on. The bit cell is coupled between the bit line (BL) and the source line (SL).

Integrating MRAM bit cells in the frontside interconnect structure has several benefits but doing so requires forming a series of island-like metal features in the frontside interconnect structure. Because MRAM bit cells are arranged in arrays, MRAM bit cells and the island-like metal features can take up space in the frontside interconnect structure and prevent routing. Embodiments of the present disclosure integrate the MRAM cells in a backside interconnect structure, which may sometimes be referred to as a super power rail (SPR) or backside power rail (BPR). According to the present disclosure, a top electrode of the MRAM cell is coupled to the drain feature of the driving transistor by way of a backside drain contact and a bottom electrode of the MRAM cell is coupled to backside bit line, also in the backside interconnect structure. It is observed that the backside integration of MRAM may reduce the device dimension by between about 10% and about 25%, such as 20%.

The various aspects of the present disclosure will now be described in more detail with reference to the figures. In that regard, FIG. 1 is a flowchart illustrating method 100 of forming a semiconductor structure according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-9, which are fragmentary cross-sectional views of a workpiece 200 at different stages of fabrication according to embodiments of method 100. Because the workpiece 200 will be fabricated into a semiconductor structure 200 upon conclusion of the fabrication processes, the workpiece 200 may be referred to as the semiconductor structure 200 as the context requires.

Referring to FIGS. 1 and 2, method 100 includes a block 102 where a workpiece 200 is received. Referring to FIG. 2, the workpiece 200 includes a first source feature 214S1, a second source feature 214S2, a drain feature 214D disposed between the first and second source features 214S1 and 214S2, a first active region 208A extending between the first source feature 214S1 and the drain feature 214D, a second active region 208B extending between the second source feature 214S2 and the drain feature 214D, a first gate structure 210A over the first active region 208A, a second gate structure 210B over the second active region 208B. The first source feature 214S1, the second source feature 214S2, the drain feature 214D, the first active region 208A, the second active region 208B, the first gate structure 210A, the second gate structure 210B are disposed over the substrate 202. A frontside interconnect structure 240 is disposed over the first source feature 214S1, the second source feature 214S2, the drain feature 214D, the first gate structure 210A, the second gate structure 210B. The frontside interconnect structure 240 includes a plurality of metal lines and contact vias and is electrically coupled to each of the first source feature 214S1 and the second source feature 214S2 by way of a source contact (a first source contact 222S1 or a second source contact 222S2, as the case may be) and a source contact via (a first source contact via 232S1 or a second source contact via 232S2, as the case may be).

In some embodiments, the substrate 202 includes silicon (Si). Alternatively or additionally, substrate 202 includes another elementary semiconductor, such as germanium (Ge); a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, the substrate 202 includes one or more group III-V materials, one or more group II-VI materials, or combinations thereof. In some implementations, the substrate 202 is a semiconductor-on-insulator substrate, such as a silicon-on-insulator (SOI) substrate, a silicon germanium-on-insulator (SGOI) substrate, or a germanium-on-insulator (GeOI) substrate. Semiconductor-on-insulator substrates can be fabricated using separation by implantation of oxygen (SIMOX), wafer bonding, and/or other suitable methods.

In some embodiments, each of the first active region 208A and the second active region 208B includes a plurality of nanostructures 208 that are stacked vertically one over another. The plurality of nanostructures 208 serve as channels or channel members of a multi-bridge-channel (MBC) transistor. In these embodiments, the first gate structure 210A wraps around each of the plurality of nanostructures 208 of the first active region 208A and the second gate structure 210B wraps around each of the plurality of nanostructures 208 of the second active region 208B. In the depicted embodiment, the first gate structure 210A controls a first MBC transistor and the second gate structure 210B controls a second MBC transistor. Because its gate structure surrounds the channel regions, an MBC transistor may also be referred to as a surrounding gate transistor (SGT) or a gate-all-around (GAA) transistor. The nanostructures 208 of an MBC transistor may come in shapes of nanowires, nanosheets, or other nanostructures. The shapes of the channel regions have also given an MBC transistor alternative names such as a nanosheet transistor or a nanowire transistor. In some other embodiments not explicitly shown, each of the first active region 208A and the second active region 208B includes a fin structure and the transistors formed thereon are fin-type field effect transistors (FinFETs). In some implementations, the nanostructures 208 may be formed of silicon (Si). The first active region 208A and the second active region 208B are formed from a stack of epitaxial layers disposed over the substrate 202 and the substrate 202 itself. The stack of epitaxial layers includes first semiconductor layers that eventually form the nanostructures 208 and second semiconductor layers interleaving the first semiconductor layers. The second semiconductor layers are sacrificial layers that are removed to release the first semiconductor layers as the nanostructures 208. In some instances, the second semiconductor layers may include silicon germanium (SiGe). The nanostructures 208 are interleaved by inner spacer features 212 that separate the first source feature 214S1, the second source feature 214S2, the drain feature 214D from the first gate structure 210A or the second gate structure 210B. The inner spacer features 212 may include silicon oxycarbonitride, silicon nitride, or silicon oxynitride.

As shown in FIG. 2, the first active region 208A extends between the first source feature 214S1 and the drain feature 214D and the second active region 208B extends between the second source feature 214S2 and the drain feature 214D. Depending on the conductivity types, the first source feature 214S1, the second source feature 214S2, and the drain feature 214D may be n-type and may include silicon (Si) doped with an n-type dopant, such as phosphorus (P) or arsenic (As); or the first source feature 214S1, the second source feature 214S2, and the drain feature 214D may include silicon germanium (SiGe) doped with an p-type dopant, such as boron (B) or boron difluoride (BF2). While not explicitly shown in FIG. 2, an isolation feature is also formed around the first active region 208A and the second active region 208B. The isolation feature may also be referred to as a shallow trench isolation (STI) feature and may be formed of one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof. In some embodiments, the workpiece 200 includes a sacrificial plug 206 disposed directly below the drain feature 214D. The sacrificial plug 206 may be formed of a semiconductor material different from the material of the substrate 202. In some instances, the sacrificial plug 206 may include silicon germanium (SiGe) or germanium (Ge). The sacrificial plug 206 serves as a placeholder for a backside drain contact 266, to be described below. The sacrificial plug 206 may be undoped or not intentionally doped.

Each of the first gate structure 210A and the second gate structure 210B includes an interfacial layer, a gate dielectric layer over the interfacial layer, and a gate electrode layer over the gate dielectric layer. The interfacial layer includes silicon oxide and may be formed in a pre-clean process. The gate dielectric layer may include, a high-k dielectric material having a dielectric constant greater than that of silicon dioxide, which is about 3.9. In some embodiments, the gate dielectric layer may include titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (La-SiO), aluminum silicon oxide (AlSiO), hafnium tantalum oxide (HfTaO), hafnium titanium oxide (HfTiO), (Ba,Sr) $TiO_3$ (BST), silicon nitride (SiN), silicon oxynitride (SiON), combinations thereof, or other suitable material. The gate electrode layer may include multiple layer, such as various combinations of a metal layer with a selected work function to enhance the device performance (work function metal layer), a liner layer, a glue layer, a blocking layer, a metal fill. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. One or more gate spacers 211 are disposed along sidewalls of the first gate structure 210A or the second gate structure 210B along the topmost nanostructures 208. The one of more gate spacers 211 may include silicon nitride, silicon oxycarbonitride, or silicon oxynitride. Because of their locations over the topmost nanostructures 208, the one or more gate spacers 211 may also be referred to as top spacers 211.

The workpiece 200 further includes a contact etch stop layer (CESL) 216 and a first interlayer dielectric (ILD) layer 218 over each of the first source feature 214S1, the second source feature 214S2, and the drain feature 214D. The CESL 216 may include silicon nitride, silicon oxynitride, and/or other materials known in the art. The first ILD layer 218 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. A first source contact 222S1 extends through the CESL 216 and the first ILD layer 218 to couple to the first source feature 214S1 by way of a silicide feature 220. A second source contact 222S2 extends through the CESL 216 and the first ILD layer 218 to couple to the second source feature 214S2 by way of a silicide feature 220. The first source contact 222S1 and the second source contact 222S2 may include ruthenium (Ru), copper (Cu), nickel (Ni), cobalt (Co), tungsten (W). The silicide feature 220 may include titanium silicide (TiSi), titanium silicon nitride (TiSiN), tantalum silicide (TaSi), tungsten silicide (WSi), cobalt silicide (CoSi), or nickel silicide (NiSi).

The workpiece 200 further includes a first etch stop layer (ESL) 224 over the first source contact 222S1, the first ILD layer 218, the CESL 216, and the second source contact 222S2. The first ESL 224 may have a composition similar to that of the CESL 216. A second ILD layer 226 is disposed over the first ESL 224. The second ILD layer 226 may be similar to the first ILD layer 218 in terms of composition. A first source contact via 232S1 extends through the second ILD layer 226 and the first ESL 224 to couple to the first source contact 222S1. A second source contact via 232S2 extends through the second ILD layer 226 and the first ESL 224 to couple to the second source contact 222S2. The first source contact via 232S1 and the second source contact via 232S2 may include ruthenium (Ru), copper (Cu), nickel (Ni), cobalt (Co), or tungsten (W) and may also include a barrier layer formed of metal nitride, such as titanium nitride or tantalum nitride.

Referring to FIGS. 1 and 2, method 100 includes a block 104 where a frontside interconnect structure 240 is formed over the workpiece 200. In some embodiments, the frontside interconnect structure 240 may include multiple intermetal dielectric (IMD) layers and multiple metal lines or contact vias in each of the IMD layers. In some instances, the IMD layers and the first ILD layer 218 may share similar composition. The metal lines and contact vias in each IMD layer may be formed of metal, such as aluminum (Al), tungsten (W), ruthenium (Ru), or copper (Cu). In some embodiments, the metal lines and contact vias may be lined by a barrier layer to insulate the metal lines and contact vias from the IMD layers and to prevent electro-migration. The barrier layer may include titanium nitride or tantalum nitride. Metal lines in the frontside interconnect structure 240 are coupled to the first source contact via 232S1 and the second source contact via 232S2.

Figure 3:
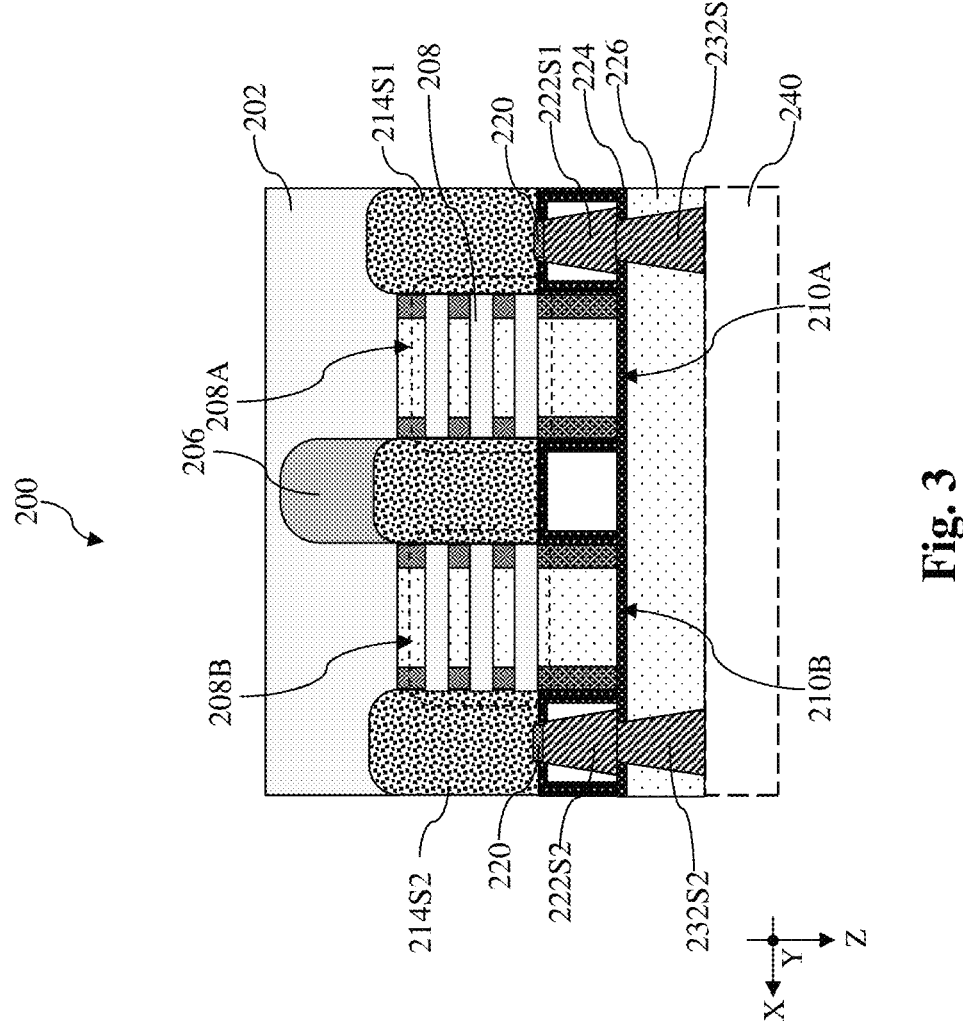
Figure 4:
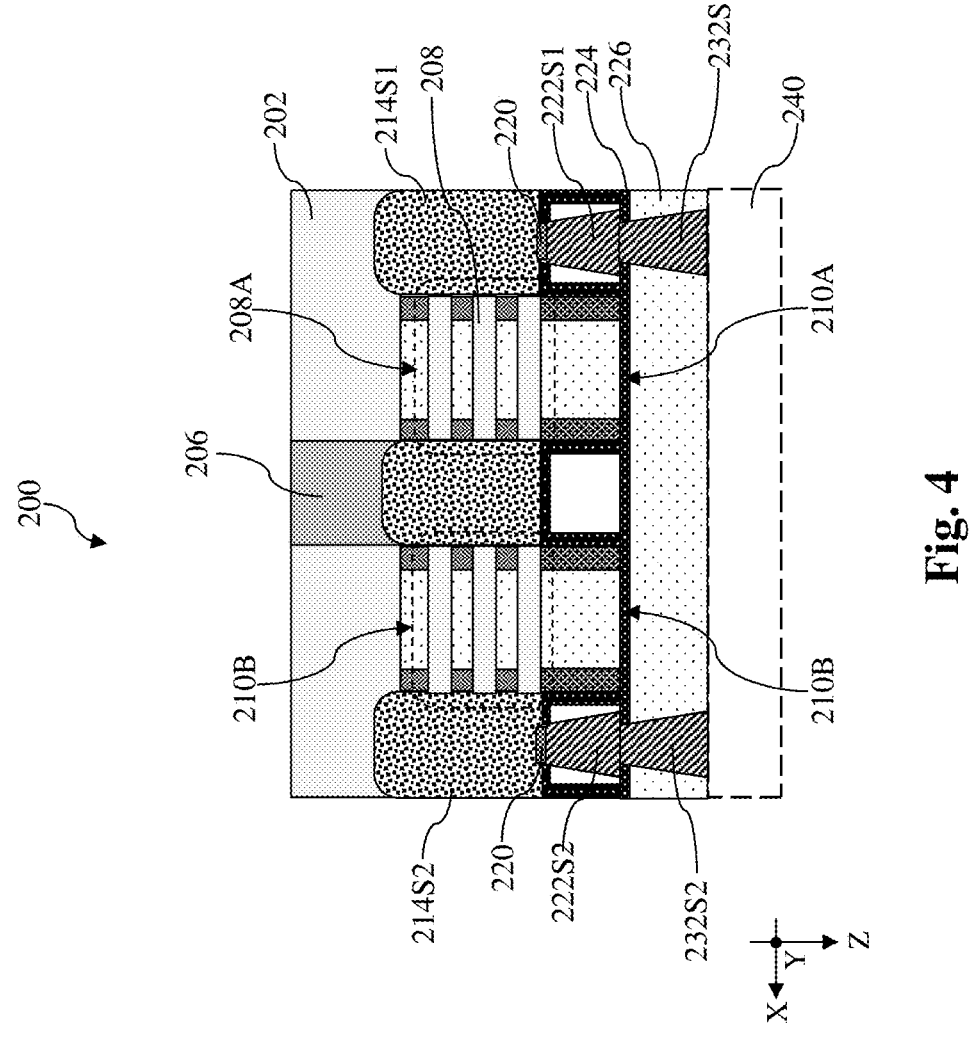

Referring to FIGS. 1, 3 and 4, method 100 includes a block 106 where the workpiece 200 is flipped up-side-down. In some embodiments, a carrier substrate (not shown) may be bonded to the frontside interconnect structure 240 and the workpiece 200 is flipped up-side-down such that a back side of the substrate 202 points upward, as shown in FIG. 3. The carrier substrate may be formed of semiconductor materials (such as silicon), sapphire, glass, polymeric materials, or other suitable materials. Referring to FIG. 4, the back side of the workpiece 200 is planarized until a top surface of the sacrificial plug 206 is coplanar with a top surface of the substrate 202. While not shown, the isolation feature are also exposed in the planar top surface.

Figure 5:
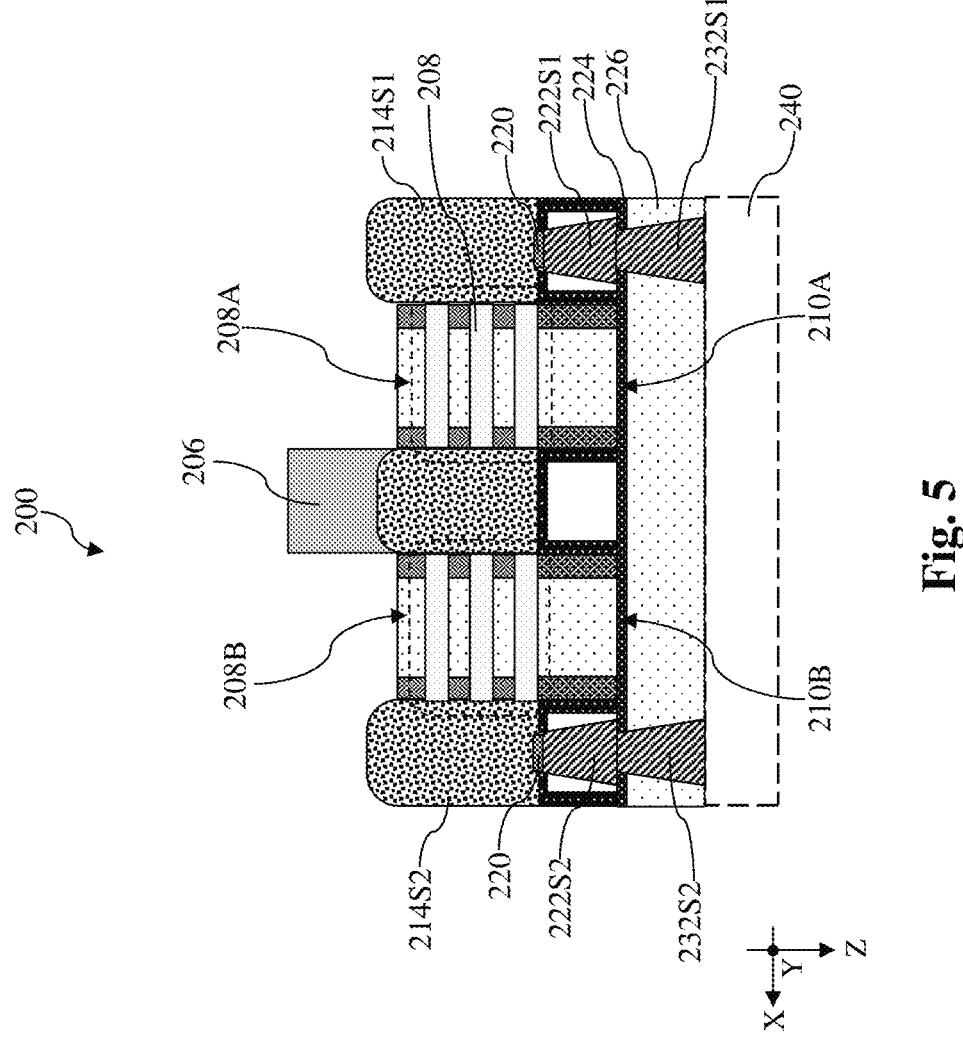
Figure 6:
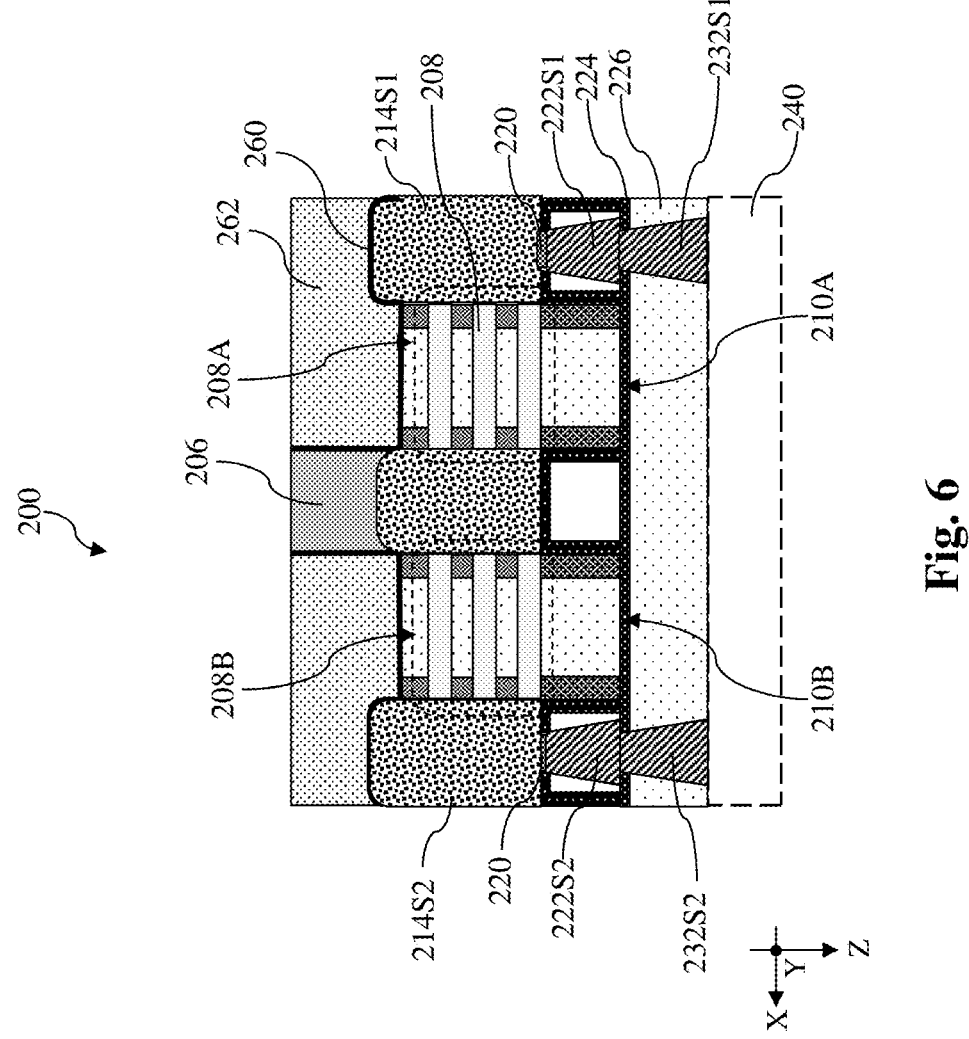

Referring to FIGS. 1 and 5-7, method 100 includes a block 108 where a backside drain contact 266 is formed to couple to the drain feature 214D. Operations at block 108 include removal of the substrate 202 (shown in FIG. 5), deposition of a liner 260 (shown in FIG. 6), deposition of a backside dielectric layer 262 (shown in FIG. 6), and replacement of the sacrificial plug 206 with a backside drain contact 266 (shown in FIG. 7). Referring to FIG. 5, because the sacrificial plug 206 and the substrate 202 are formed of different materials, the substrate 202 may be selectively removed using a selective dry etch process or a selective wet etch process. After the removal of the substrate 202, the liner 260 is deposited over the back side of the workpiece 200 using ALD or CVD, as illustrated in FIG. 6. In some embodiments, the liner 260 may include silicon nitride. A backside dielectric layer 262 is then deposited over the liner 260 using spin-on coating, CVD, or plasma enhanced CVD (PECVD). The backside dielectric layer 262 may include silicon oxide. After the deposition of the liner 260 and the backside dielectric layer 262, a planarization process, such as a CMP process, is performed to provide planar backside surface. After the planarization process, the sacrificial plug 206 is embedded in the backside dielectric layer 262 and the isolation feature. The sacrificial plug 206 is then replaced with a backside drain contact 266.

Figure 7:
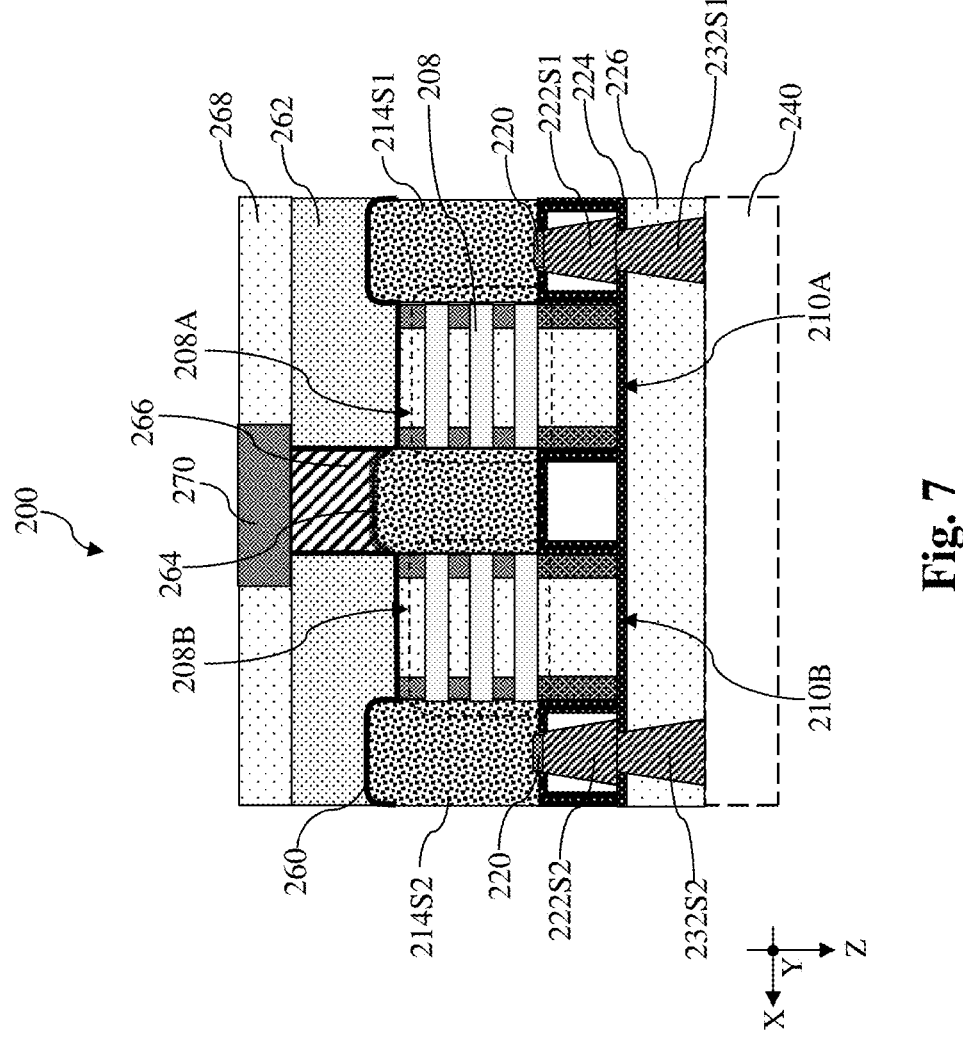

In an example process, the sacrificial plug 206 is selectively removed to form a backside drain opening to expose the drain feature 214D. Then, a backside silicide layer 264 is formed over the exposed surface of the drain feature 214D and the backside drain contact 266 is deposited over the silicide layer 264. The selective removal of the sacrificial plug 206 may be performed using a selective wet etch process or a selective dry etch process. To reduce contact resistance between the drain feature 214D and the backside drain contact 266, the silicide layer 264 may be formed on the exposed surface of the drain feature 214D in the backside drain opening. The silicide layer 264 may include titanium silicide (TiSi), titanium silicon nitride (TiSiN), tantalum silicide (TaSi), tungsten silicide (WSi), cobalt silicide (CoSi), or nickel silicide (NiSi). After the formation of the silicide layer 264, a metal fill layer may be deposited into the backside drain opening to form the backside drain contact 266, as illustrated in FIG. 7. The metal fill layer may include aluminum (Al), rhodium (Rh), ruthenium (Ru), copper (Cu), iridium (Ir), or tungsten (W). A planarization process, such as a CMP process, may follow to remove excess materials and provide a planar top surface. The backside drain contact 266 is in direct contact with the silicide layer 264, which is in direct contact with the drain feature 214D. In other words, the silicide layer 264 is sandwiched between the drain feature 214D and the backside drain contact 266.

Referring to FIGS. 1 and 7, method 100 includes a block 110 where a first backside metal line 270 is formed over the backside drain contact 266. The first backside metal line 270 is formed in a third ILD layer 268. In an example process, the third ILD layer 268 includes a composition similar to the first ILD layer 218 and is deposited over the back side of the workpiece 200, including over the backside dielectric layer 262, the isolation feature, the liner 260, and the backside drain contact 266. Then, a trench may be patterned in the third ILD layer 268. A barrier layer and a metal fill material are then deposited into the trench to form a first backside metal line 270 over the backside drain contact 266. In some embodiments, the barrier layer in the first backside metal line 270 may include titanium nitride, tantalum nitride, cobalt nitride, nickel nitride, or tungsten nitride and the metal fill material in the first backside metal line 270 may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the third ILD layer 268.

Figure 8:
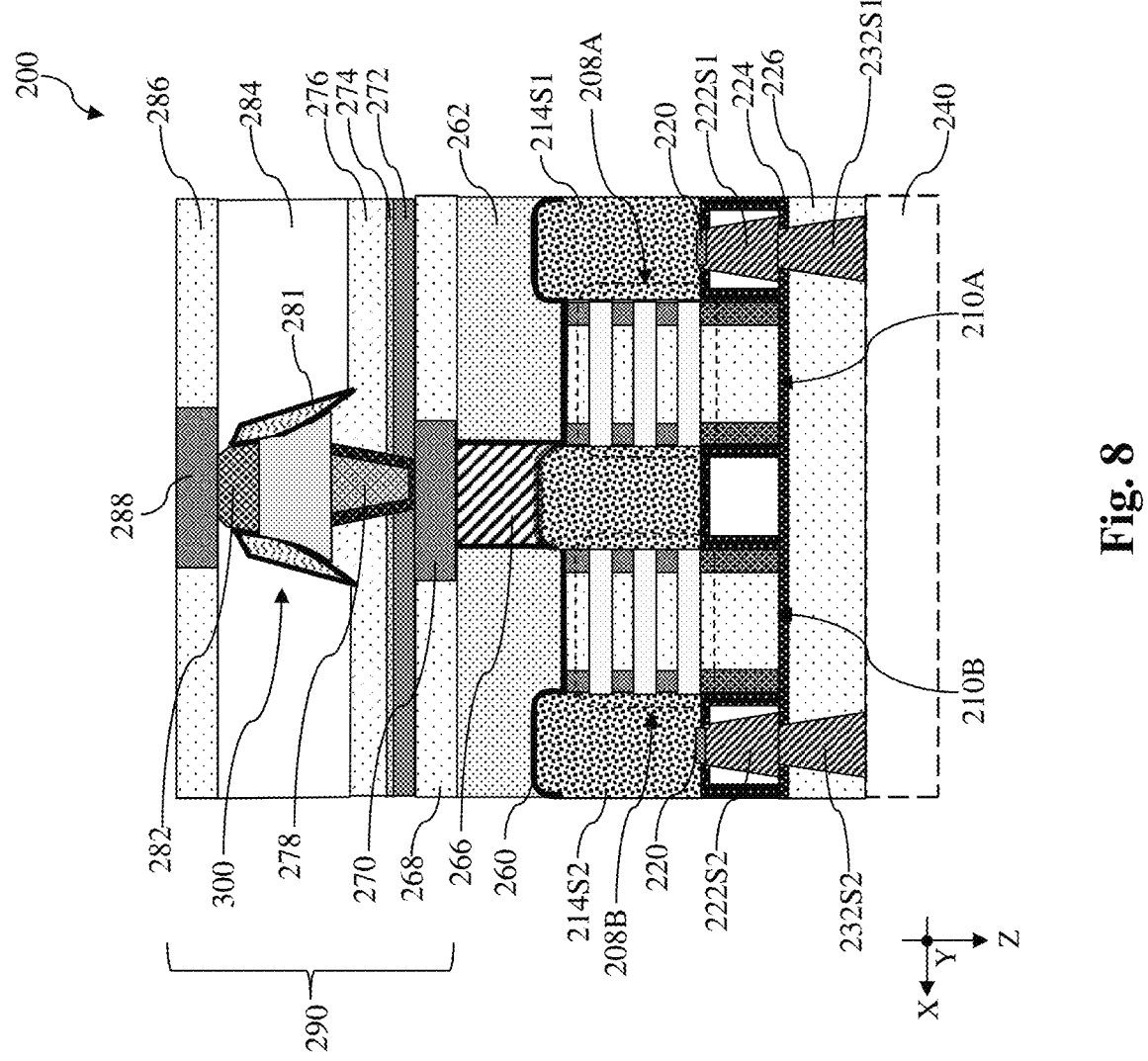

Referring to FIGS. 1 and 8, method 100 includes a block 112 where a storage element 300 is formed over the first backside metal line 270. In some embodiments, the storage element 300 is an MRAM storage element or an MRAM cell and includes an MTJ structure. In an example process, a second ESL 272, a protective layer 274, and a dielectric layer 276 are formed over the back side of the workpiece 200. The second ESL 272 may include silicon nitride, the protective layer 274 may include aluminum oxide, aluminum nitride, or aluminum oxynitride, and the the the dielectric layer 276 may include silicon carbide (SiC), silicon oxynitride (SiON), silicon nitride (SiN), silicon dioxide, TEOS, low-k dielectrics, FSG, PSG, BPSG, the like, and/or combinations thereof. Reference is still made to FIG. 8. A top electrode vias (TEVA) 278 is formed to extend through the second ESL 272, the protective layer 274 and the dielectric layer 276. TEVA 278 may include titanium nitride (TiN), tantalum nitride (TaN), titanium (Ti), tantalum (Ta), platinum (Pt), ruthenium (Ru), tungsten (W), aluminum (Al), copper (Cu), the like, and/or combinations thereof.

Figure 10:
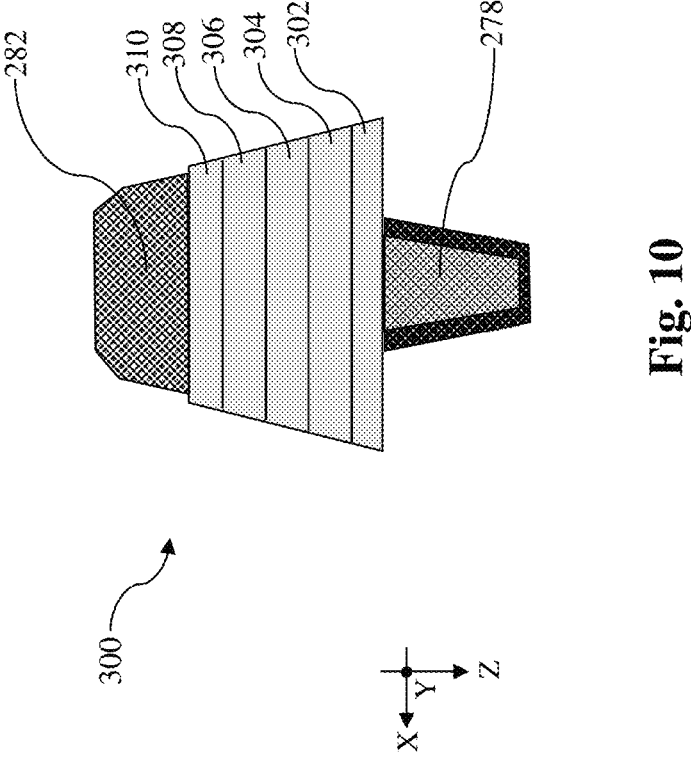
FIG. 10 illustrates an enlarged fragmentary cross-sectional view of a storage element, according to one or more aspects of the present disclosure.

The storage element 300 is then formed on the TEVA 278. An enlarged cross-sectional view of the storage element 300 is shown in FIG. 10. In some embodiments, the storage element 300 includes a top electrode 302 in contact with the TEVA 278, a pinned layer 304 over the top electrode 302, a tunnel barrier layer 306 over the pinned layer 304, a free layer 308 over the tunnel barrier layer 306, and a bottom electrode 310. The top electrode 302 and the bottom electrode 310 may include titanium (Ti), tantalum (Ta), platinum (Pt), ruthenium (Ru), tungsten (W), aluminum (Al), copper (Cu), TiN, TaN, the like, and/or a combination thereof. Although the bottom electrode 310 appears to be over the top electrode 302 in FIG. 10, the top electrode 302 will be on top after the workpiece 200 is flipped over. The pinned layer 304 may include cobalt-iron-boron (CoFeB), CoFeTa, NiFe, Co, CoFe, CoPt, an alloy of Ni, Co and Fe, platinum manganese (PtMn), iridium manganese (IrMn), rhodium manganese (RhMn), iron manganese (FeMn), or OsMn. The tunnel barrier layer 306 may include magnesium oxide (MgO), aluminum oxide (Al2O3), aluminum nitride (AlN), aluminum oxynitride (AlON), hafnium oxide (HfO2) or zirconium oxide (ZrO2). The free layer 308 may include cobalt, nickel, iron or boron. The pinned layer 304, the tunnel barrier layer 306 and the free layer 308 constitute a magnetic tunneling junction (MTJ) structure. Sidewalls of the storage element 300 are lined by a spacer 281. The spacer 281 includes silicon nitride, silicon carbide, silicon oxycarbonitride, or silicon oxycarbide. After the formation of the storage element 300, a bottom electrode via (BEVA) 282 is formed over the bottom electrode 310 to couple thereto. Like the top electrode via (TEVA) 278, the bottom electrode via (BEVA) 282 may include titanium nitride (TiN), tantalum nitride (TaN), titanium (Ti), tantalum (Ta), platinum (Pt), ruthenium (Ru), tungsten (W), aluminum (Al), copper (Cu), the like, and/or combinations thereof. The storage element 300, including the bottom electrode via (BEVA) 282, are disposed in a fourth ILD layer 284. A composition of the fourth ILD layer 284 may be similar to that of the first ILD layer 218.

Referring to FIGS. 1 and 8, method 100 includes a block 114 where a second backside metal line 288 is formed over the storage element 300. The second backside metal line 288 is formed in a fifth ILD layer 286. In an example process, the fifth ILD layer 286 includes a composition similar to the first ILD layer 218 and may be deposited over the fourth ILD layer 284 and the bottom electrode via (BEVA) 282. Then, a trench may be patterned in the fifth ILD layer 286. A barrier layer and a metal fill material are then deposited into the trench to form a second backside metal line 288 directly on the bottom electrode via (BEVA) 282. In some embodiments, the barrier layer in the second backside metal line 288 may include titanium nitride, tantalum nitride, cobalt nitride, nickel nitride, or tungsten nitride and the metal fill material in the second backside metal line 288 may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the fifth ILD layer 286. The first backside metal line 270, the storage element 300, and the second backside metal line 288 are in a backside interconnect structure 290. The frontside interconnect structure 240 and the backside interconnect structure 290 are formed on different sides of the FEOL features, such as the first source feature 214S1, the second source feature 214S2, the drain feature 214D, the first gate structure 210A, the second gate structure 210B, the first active region 208A, and the second active region 208B.

Figure 9:
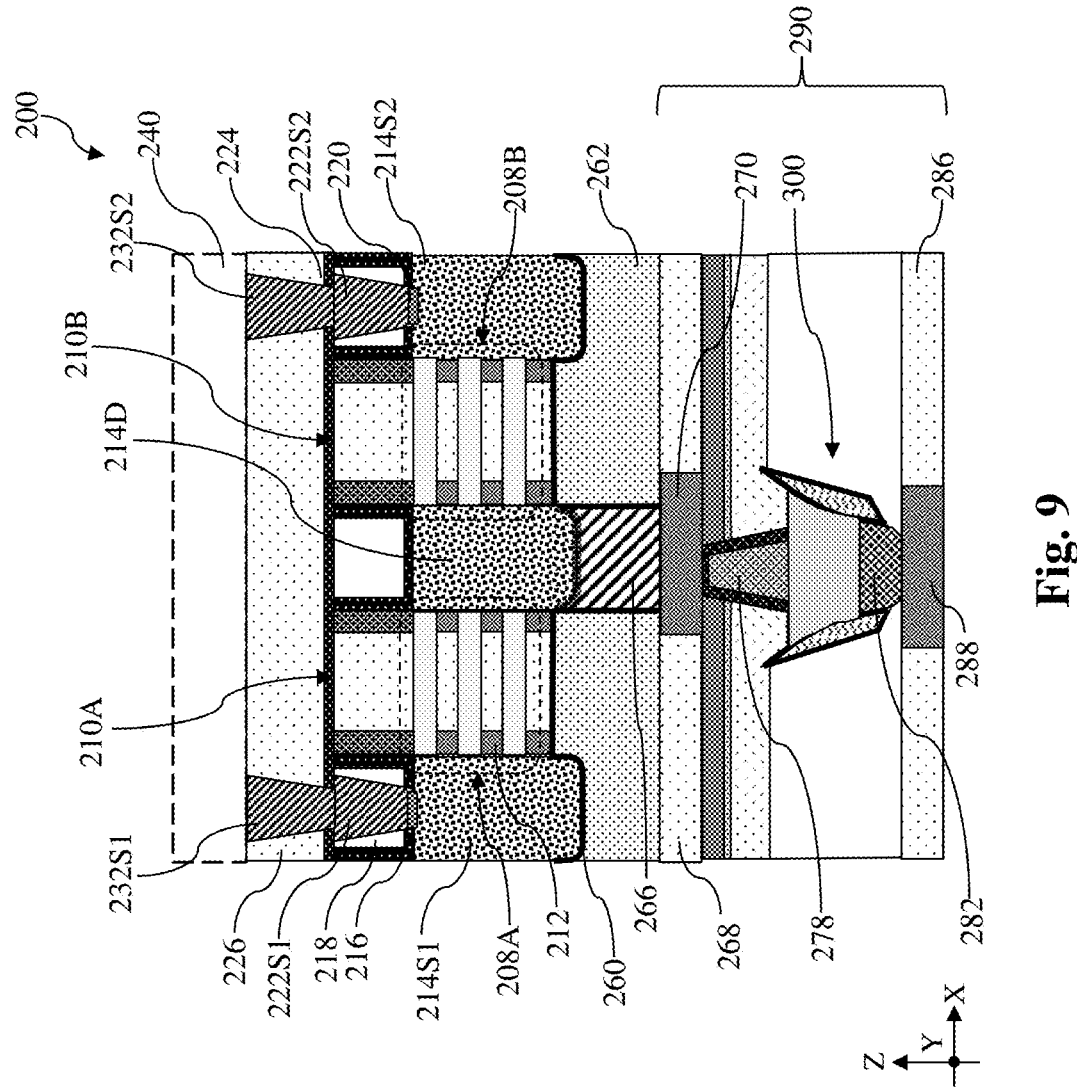

FIG. 9 illustrates the workpiece 200 that is flipped upside-down again after the operations at block 114 are performed. As shown FIG. 9, the first active region 208A extends between the first source feature 214S1 and the drain feature 214D, and the second active region 208B extends between the drain feature 214D and the second source feature 214S2. The first gate structure 210A wraps around each nanostructure 208 in the first active region 208A and the second gate structure 210B wraps around each nanostructure 208 in the second active region 208B. The first source feature 214S1 is coupled to the frontside interconnect structure 240 by way of the first source contact 222S1 and the first source contact via 232S1. The second source feature 214S2 is coupled to the frontside interconnect structure 240 by way of the second source contact 222S2 and the second source contact via 232S2. The backside drain contact 266 extends downward from the drain feature 214D through the backside dielectric layer 262. The backside drain contact 266 is spaced apart from the backside dielectric layer 262 by the liner 260. The drain feature 214D is coupled to the backside interconnect structure 290 by way of the backside drain contact 266. Particularly, the backside drain contact 266 is disposed on the first backside metal line 270, which is coupled to the top electrode via (TEVA) 278. The top electrode via (TEVA) 278 is coupled to the top electrode of the storage element 300. The bottom electrode 310 of the storage element 300 is coupled to the bottom electrode via (BEVA) 282. The bottom electrode via (BEVA) 282 is disposed on or electrically coupled to the second backside metal line 288.

Figure 11:
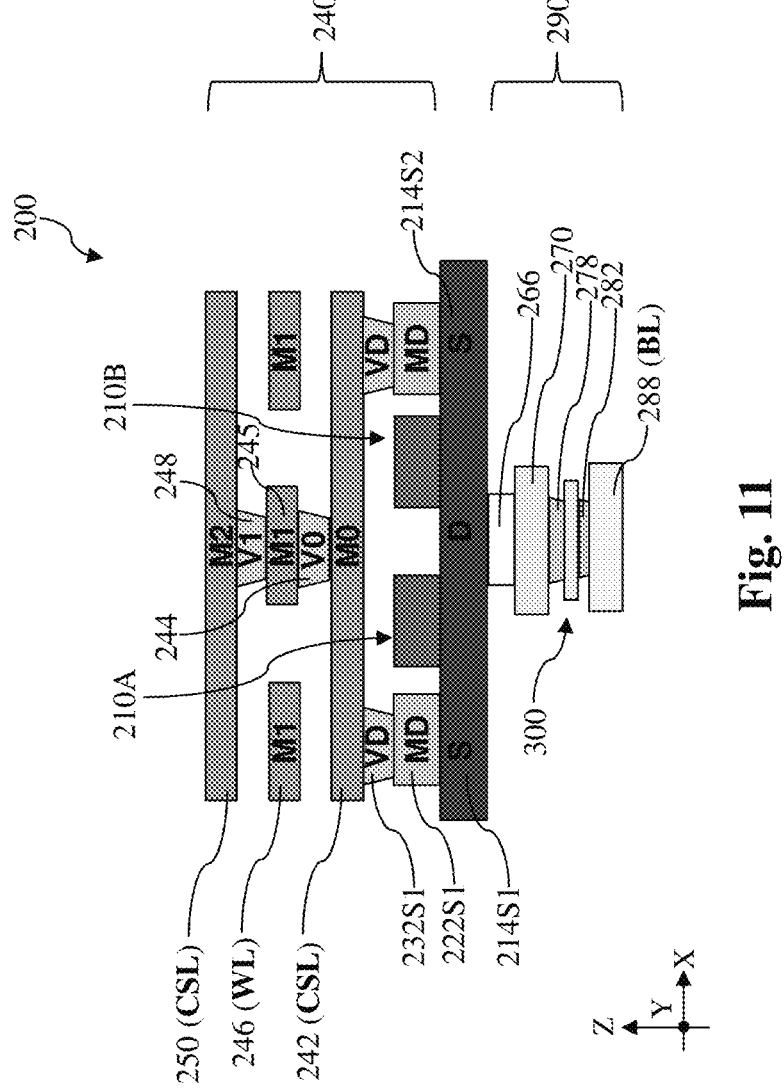
FIG. 11 illustrates a schematic cross-sectional view of interconnect features in a semiconductor structure according to one or more aspects of the present disclosure.

FIG. 11 represents a schematic illustration of FIG. 9 in terms of operation of the storage element 300 in the backside interconnect structure 290. The second backside metal line 288 serves as a bit line (BL). The frontside interconnect structure 240 includes a plurality of metal layers coupled together by contact vias. For examples, the frontside interconnect structure 240 includes a first metal layer MO, a second metal layer M1, and a third metal layer M2. A metal line 242 in the first metal layer MO is disposed on and coupled to the first source contact via 232S1 and the second source contact via 232S2. A metal line 250 in the third metal layer M2 is disposed over the metal line 242 and is coupled to the metal line 242 by way of a contact via 244, a contact via 248, and a metal line 245 in the second metal layer M1. The metal line 242 and the metal line 250 collectively serve as a common source line (CSL) to reduce line resistance. A metal line 246 is electrically coupled to both the first gate structure 210A and the second gate structure 210B to serve as a word line (WL).

Figure 12:
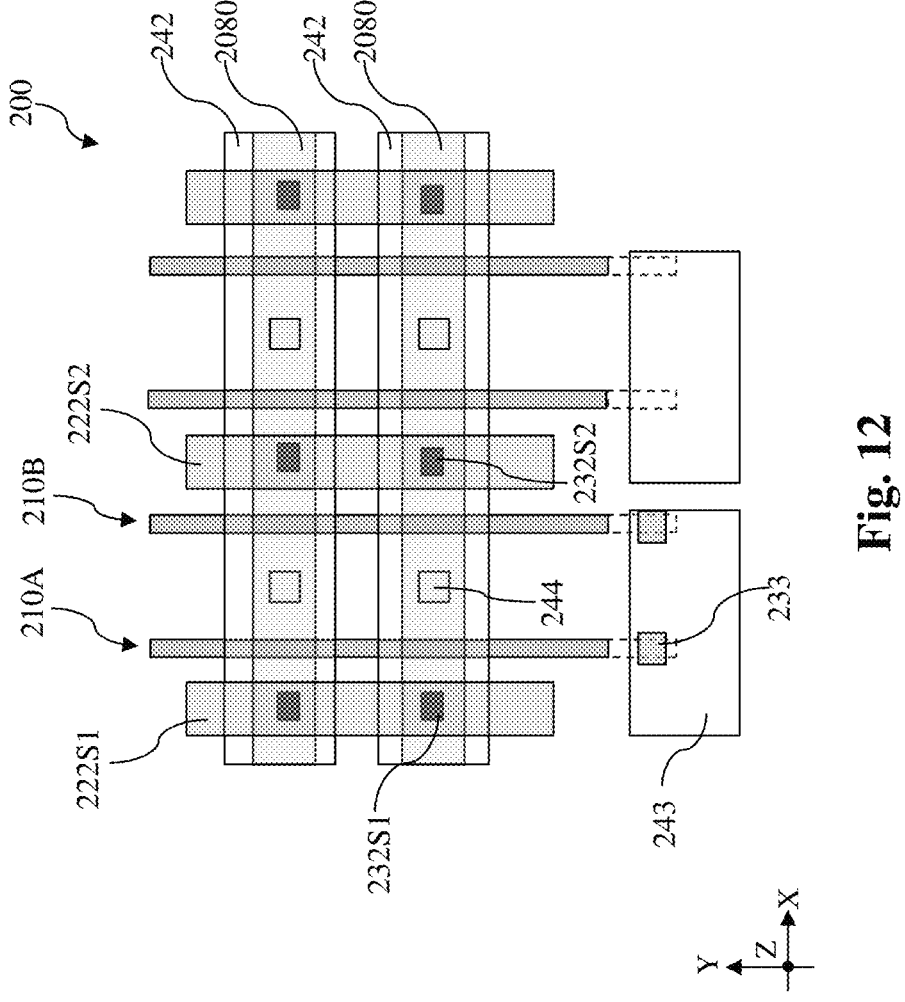
FIGS. 12-14 illustrate top layout views of a semiconductor structure, according to one or more aspects of the present disclosure.
Figure 13:
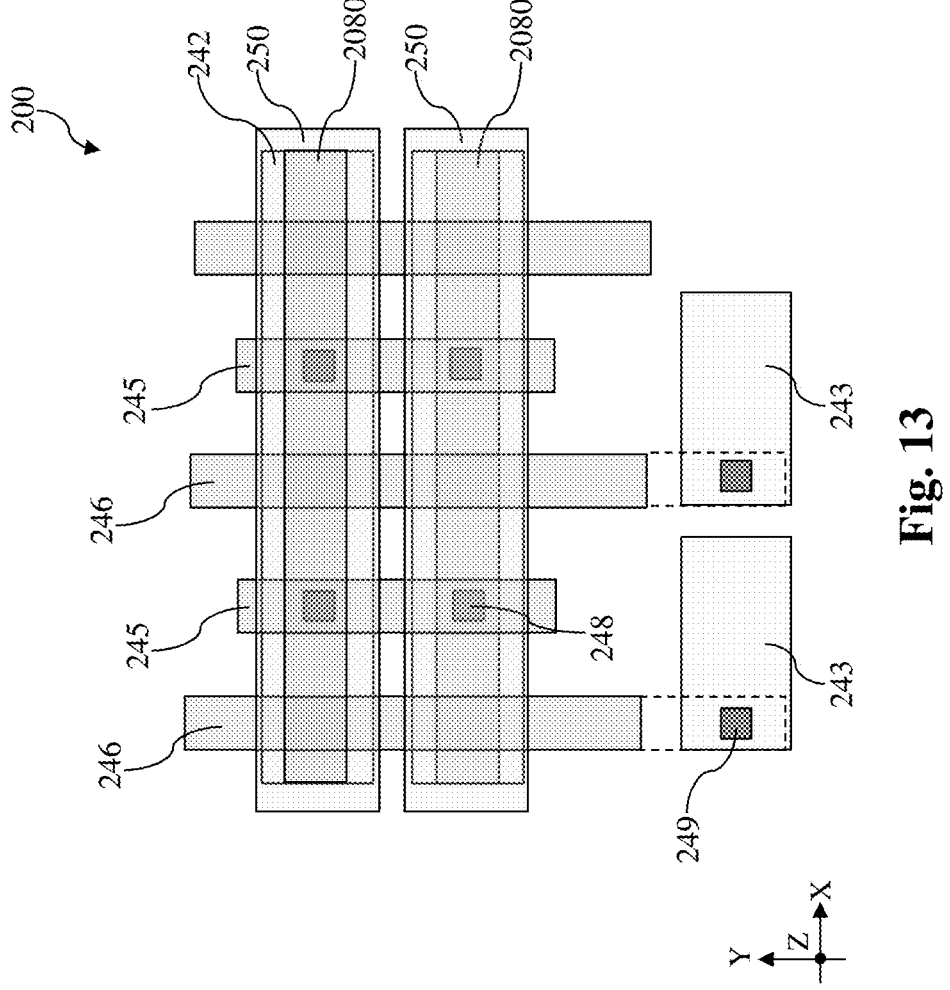
Figure 14:
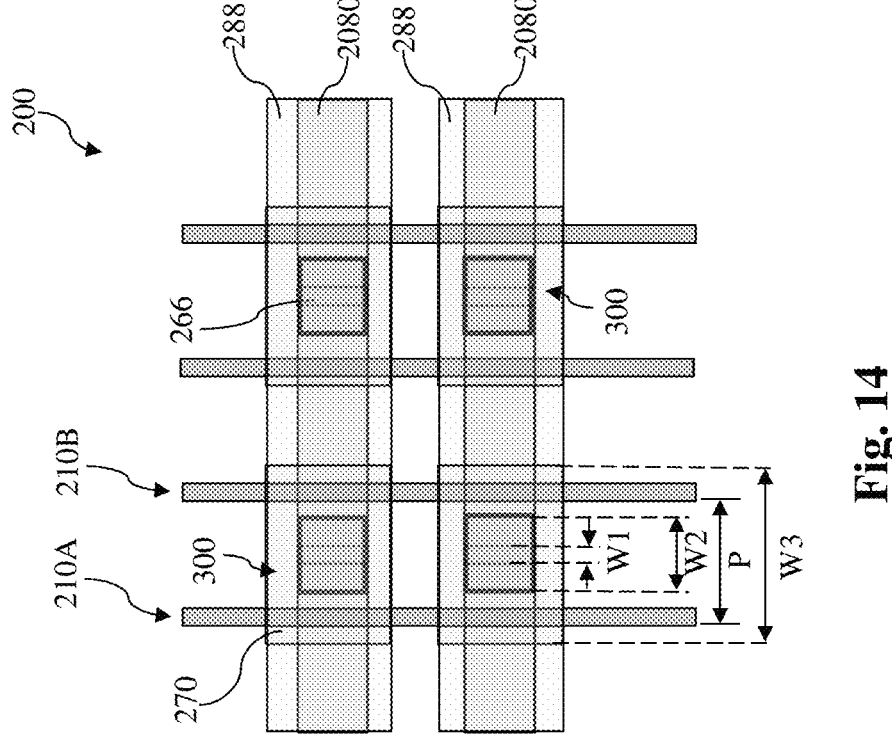

The various connections and routings are realized by layouts shown in FIGS. 12-14. FIG. 12 illustrates a fragmentary top layout view of the source contacts, source contact vias, the first metal layer (MO) and the contact via between the first metal layer (MO) and the second metal layer (M1). As shown in FIG. 12, the first active region 208A and the second active region 208B extend lengthwise along the X direction and are representatively shown as a continuous active region 2080. The gate structures, such as the first gate structure 210A and the second gate structure 210B, extend lengthwise along the Y direction. Each pairs of gate structures between two adjacent source contacts are connected, through a gate contact via 233, to a metal feature 243 in the first metal layer MO, which will be electrically coupled to the metal line 246 (WL) in the second metal layer M1. Each of the first source contact 222S1 and the second source contact 222S2 extends lengthwise along the Y direction to connect an array of source features, such as the first source feature 214S1 and the second source feature 214S2. The first source contact 222S1 is coupled to conductive lines in the first metal layer MO by way of a first source contact via 232S1 and the second source contact 222S2 is coupled to the conductive lines in the first metal layer MO by way of a second source contact via 232S2. Contact vias 244 connect the metal line 242 in the first metal layer (MO) and the metal line 245 in the second metal layer (M1). The first source contact via 232S1, the second source contact via 232S2 and the contact vias 244 may be equilateral when viewed from the top along the Z direction. In some embodiments, the first source contact via 232S1 or the second source contact via 232S2 includes an X/Y direction dimension between 10 nm and about 16 nm. Each of the contact vias 244 includes an X-Y direction dimension between about 10 nm and about 20 nm. The gate structures, including the first gate structure 210A and the second gate structure 210B, are disposed at a pitch P, which may be between about 30 nm and about 65 nm. A ratio of a dimension of the first source contact via 232S1 (or the second source contact via 232S2) to the pitch P may be between 0.3 and about 0.5. This ratio is not trivial.

When the ratio is smaller than 0.3, the resistance of source contact vias may be increased to impact device performance. When the ratio is greater than 0.5, the process window to form the source contact via may become too small and the capacitance between the source contact via and adjacent gate structures may be increased to impact device performance.

Referring then to FIG. 13, the metal feature 243 in the first metal layer M0 is coupled to the metal line 246 (WL) by way of a contact via 249. It is noted that the metal feature 243 and the contact via 249 are located in a peripheral region. The metal line 246 (WL) is disposed directly over the first source contact via 232S1, the first source contact 222S1, and the first source feature 214S1 (shown in FIG. 9). The metal line 245 in the second metal layer M1 extends along the Y direction, in parallel with the metal line 246. The metal line 245 is disposed directly over the contact via 248 and the drain feature 214D (shown in FIG. 9). The metal lines 245 and 246 are disposed at a pitch between 30 nm and about 60 nm. In some instances, each of the metal lines 245 and 246 includes an X-direction width between about 14 nm and 30 nm. Because the contact via 248 is situated in a metal layer above the source contact vias (e.g., 232S1 and 232S2) and the contact vias 244, the contact via 248 may have a larger cross-sectional area. In some instances, the X/Y direction dimension of the contact via 248 may be between about 10 nm and about 24 nm.

Reference is finally made to FIG. 14, which is a backside top layout view of the backside interconnect structure 290. The top projection area of the backside drain contact 266 is similar to that of the drain feature 214D. Each of the first backside metal lines 270 resembles an island and is implemented to enlarge the contact area of the backside drain contact 266. Vertically, a portion of the first backside metal line 270 vertically overlaps the first gate structure 210A and the second gate structure 210B. The storage elements 300 are formed over the first backside metal lines 270. The second backside metal line 288 extends along the X direction over the storage elements and the first backside metal lines 270. The second backside metal line 288 extends over the continuous active region 2080 and serves as the bit line (BL).

Referring still to FIG. 14, the backside drain contact 266 includes a first width W1 along the X direction. In some instances, the first width W1 is between about 5 nm and about 30 nm. The backside drain contact 266 also includes a Y-direction dimension between about 20 nm and about 40 nm, which is substantially defined by the Y-direction dimension of the active regions 2080. The widest portion of the storage element 300 includes a second width W2 along the X direction. In some instances, the second width W2 is between about 20 nm and about 60 nm. The largest Y direction dimension of the storage element 300 may be similar to the second width W2. In some implementations, a ratio of the second width to the Y direction dimension of the storage element 300 is between about 1 and 1.2. The first backside metal line 270 includes a third width W3 along the X direction. In some instances, the third width W3 may be between 30 nm and about 75 nm. According to the present disclosure, the third width W3 is greater than the second width W2 to ensure satisfactory landing of the top electrode via (TEVA) 278 on the first backside metal line 270.

Figure 15:
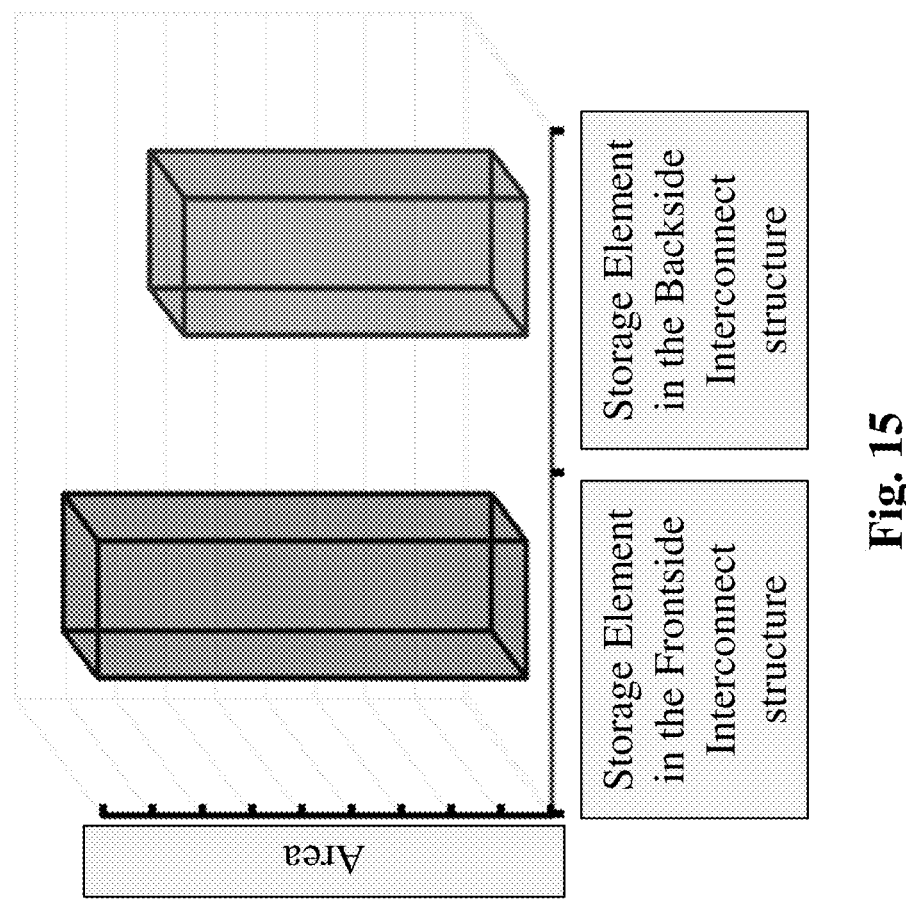
FIG. 15 illustrates area reduction by including a storage element in a backside interconnect structure, according to one or more aspects of the present disclosure.

Embodiments of the present disclosure provide advantages. As shown in FIG. 15, by moving the storage element and the connection features of the storage elements from the frontside interconnect structure to the backside interconnect structure, the device area may be reduced by between about 15% and about 25%, such as 20%. The free-up space in the frontside interconnect structure may be utilized to integrate additional back-end-of-line features, to reduce routing density, or to reduce device dimensions.

In one exemplary aspect, the present disclosure is directed to a semiconductor structure. The semiconductor structure includes a source feature and a drain feature, an active region between the source feature and the drain feature, a gate structure over the active region, a frontside interconnect structure disposed over the source feature, the drain feature, and the gate structure, a backside interconnect structure disposed below the source feature, the drain feature, and the gate structure, and a storage element disposed in the backside interconnect structure.

In some embodiments, the storage element is a magneto-resistive random-access (MRAM) element. In some embodiments, the active region includes a plurality of nanostructures extending between the source feature and the drain feature. In some implementations, the gate structure wraps around each of the plurality of nanostructures. In some instances, the frontside interconnect structure is coupled to source feature and the gate structure and the backside interconnect structure is coupled to the storage element. In some embodiments, the frontside interconnect structure is coupled to source contact by way of a source contact and a source contact via disposed over the source contact. In some embodiments, the backside interconnect structure is coupled to the drain feature by way of a backside drain contact. In some implementations, the backside interconnect structure further includes a first metal line disposed between the backside drain contact and the storage element, and a second metal line disposed below the storage element such that the storage element is disposed between the first metal line and the second metal line. In some instances, the storage element includes a bottom electrode via disposed on the second metal line, a bottom electrode disposed on the bottom electrode via, a top electrode disposed over the bottom electrode, a magnetic tunnel junction (MTJ) layer sandwiched between the bottom electrode and the top electrode, and a top electrode via disposed between the top electrode and the first metal line.

In another exemplary aspect, the present disclosure is directed to a semiconductor structure. The semiconductor structure includes a first source feature and a second source feature, a drain feature disposed between the first source feature and the second source feature, a first active region extending between the first source feature and the drain feature, a second active region extending between the drain feature and the second source feature, a first gate structure over the first active region, a second gate structure over the second active region, a frontside interconnect structure disposed over and electrically coupled to the first source feature, the second source feature, the first gate structure, and the second gate structure, a backside interconnect structure disposed below the first source feature, the second source feature, the drain feature, the first gate structure, and the second gate structure, and a storage element disposed in the backside interconnect structure. The backside interconnect structure is electrically coupled to the drain feature.

In some embodiments, the storage element is a magneto-resistive random-access (MRAM) element. In some implementations, the first active region includes a first plurality of nanostructures stacked one over another and the second active region includes a second plurality of nanostructures stacked one over another. In some embodiments, the first gate structure wraps around each of the first plurality of nanostructures and the second gate structure wraps around each of the second plurality of nanostructures. In some instances, the frontside interconnect structure is coupled to the first source feature by way of a first source contact and a first source contact via disposed over the first source contact, the frontside interconnect structure is coupled to the second source feature by way of a second source contact and a second source contact via disposed over the second source contact, and the backside interconnect structure is coupled to the drain feature by way of a backside drain contact. In some embodiments, the first source contact is disposed over the first source feature and extending upward from the first source feature, the second source contact is disposed over the second source feature and extending upward from the second source feature, and the backside drain contact is disposed below the drain feature and extending downward from the drain feature. In some instances, the backside interconnect structure further includes a first metal line disposed between the backside drain contact and the storage element, and a second metal line disposed below the storage element such that the storage element is disposed between the first metal line and the second metal line. In some embodiments, the storage element includes a bottom electrode via disposed on the second metal line, a bottom electrode disposed on the bottom electrode via, a top electrode disposed over the bottom electrode, a magnetic tunnel junction (MTJ) layer sandwiched between the bottom electrode and the top electrode, and a top electrode via disposed between the top electrode and the first metal line.

In yet another exemplary aspect, the present disclosure is directed to a method. The method includes forming a transistor over a substrate. The transistor includes a source feature, a drain feature, an active region sandwiched between the source feature and the drain feature, and a gate structure over the active region. The method may further include forming a source contact via over and electrically coupled to the source feature, forming a frontside interconnect structure disposed over and electrically coupled to the source contact via, after the forming of the frontside interconnect structure, forming a backside drain contact electrically coupled to the drain feature and away from the frontside interconnect structure, and forming a backside interconnect structure coupled to the backside drain contact. The backside interconnect structure includes a storage element.

In some embodiments, the method may further include before the forming of the backside drain contact, flipping over the substrate such that the frontside interconnect structure is above the transistor. In some implementations, the storage element is a magneto-resistive random-access (MRAM) element.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a source feature and a drain feature disposed over and partially extending into a backside dielectric layer;

an active region between the source feature and the drain feature;

a gate structure over the active region;

a frontside interconnect structure disposed over the source feature, the drain feature, and the gate structure;

a backside interconnect structure disposed below the source feature, the drain feature, and the gate structure;

a storage element disposed in the backside interconnect structure; and a liner continuously and conformally extending from between a bottom surface of the source feature and the backside dielectric layer to between a bottom surface of the gate structure and the backside dielectric layer, wherein the liner interfaces the bottom surface of the gate structure.

2. The semiconductor structure of claim 1, wherein the storage element is a magneto-resistive random-access (MRAM) element.

3. The semiconductor structure of claim 1, wherein the active region comprises a plurality of nanostructures extending between the source feature and the drain feature.

4. The semiconductor structure of claim 3, wherein the gate structure wraps around each of the plurality of nanostructures.

5. The semiconductor structure of claim 1,
wherein the frontside interconnect structure is coupled to the source feature and the gate structure,
wherein the backside interconnect structure is electrically coupled to the drain feature.

6. The semiconductor structure of claim 1,
wherein the frontside interconnect structure is coupled to the source feature by way of a source contact and a source contact via disposed over the source contact,
wherein a silicide feature is sandwiched between the source feature and the source contact.

7. The semiconductor structure of claim 1, wherein the backside interconnect structure is coupled to the drain feature by way of a backside drain contact.

8. The semiconductor structure of claim 7, wherein the backside interconnect structure further comprises:
a first metal line disposed between the backside drain contact and the storage element; and
a second metal line disposed below the storage element such that the storage element is disposed between the first metal line and the second metal line.

9. The semiconductor structure of claim 8, wherein the storage element comprises:
a bottom electrode via disposed on the second metal line;
a bottom electrode disposed on the bottom electrode via;
a top electrode disposed over the bottom electrode;
a magnetic tunnel junction (MTJ) layer sandwiched between the bottom electrode and the top electrode; and
a top electrode via disposed between the top electrode and the first metal line.

10. A semiconductor structure, comprising:
a first source feature and a second source feature disposed over a backside dielectric layer;
a drain feature disposed between the first source feature and the second source feature;
a first active region extending between the first source feature and the drain feature;
a second active region extending between the drain feature and the second source feature;
a first gate structure over the first active region;
a second gate structure over the second active region;
a contact etch stop layer (CESL) disposed on a top surface of the first source feature;

an interlayer dielectric (ILD) layer over the CESL;

a first source contact extending through the CESL and the ILD layer to couple to the first source feature;

a backside interconnect structure disposed below the first source feature, the second source feature, the drain feature, the first gate structure, and the second gate structure; and a storage element disposed in the backside interconnect structure, wherein the backside interconnect structure is electrically coupled to the drain feature, wherein a bottom surface of the first source feature, a bottom surface of the second source feature, a bottom surface of the first gate structure, and a bottom surface of the second gate structure are spaced apart from the backside dielectric layer by a liner, wherein the liner is in direct contact with the bottom surfaces of the first gate structure and the second gate structure, wherein the liner comprises silicon nitride, wherein the backside interconnect structure directly interfaces a bottom surface of the backside dielectric layer away from the first gate structure and the second gate structure.

11. The semiconductor structure of claim 10, wherein the storage element is a magneto-resistive random-access (MRAM) element.

12. The semiconductor structure of claim 10, wherein the first active region comprises a first plurality of nanostructures stacked one over another, wherein the second active region comprises a second plurality of nanostructures stacked one over another.

13. The semiconductor structure of claim 12, wherein the first gate structure wraps around each of the first plurality of nanostructures, wherein the second gate structure wraps around each of the second plurality of nanostructures.

14. The semiconductor structure of claim 10, further comprising:

a frontside interconnect structure disposed over and electrically coupled to the first source feature, the second source feature, the first gate structure, and the second gate structure, wherein the frontside interconnect structure is coupled to the first source feature by way of the first source contact and a first source contact via disposed over the first source contact, wherein a first silicide feature is sandwiched between the first source contact and the first source feature, wherein the frontside interconnect structure is coupled to the second source feature by way of a second source contact and a second source contact via disposed over the second source contact, wherein a second silicide feature is sandwiched between the second source contact and the second source feature, wherein the backside interconnect structure is coupled to the drain feature by way of a backside drain contact.

15. The semiconductor structure of claim 14, wherein the first source contact is disposed over the first source feature and extending upward from the first source feature, wherein the second source contact is disposed over the second source feature and extending upward from the second source feature, wherein the backside drain contact is disposed below the drain feature and extending downward from the drain feature.

16. The semiconductor structure of claim 14, wherein the backside interconnect structure further comprises:

a first metal line disposed between the backside drain contact and the storage element; and a second metal line disposed below the storage element such that the storage element is disposed between the first metal line and the second metal line.

17. The semiconductor structure of claim 16, wherein the storage element comprises:

a bottom electrode via disposed on the second metal line;

a bottom electrode disposed on the bottom electrode via;

a top electrode disposed over the bottom electrode;

a magnetic tunnel junction (MTJ) layer sandwiched between the bottom electrode and the top electrode; and a top electrode via disposed between the top electrode and the first metal line.

18. A semiconductor structure, comprising:

a source feature and a drain feature disposed over and partially extending into a backside dielectric layer;

an active region extending between the source feature and the drain feature;

a gate structure over the active region;

a frontside interconnect structure disposed over the source feature, the drain feature, and the gate structure;

a backside interconnect structure disposed below the source feature, the drain feature, and the gate structure;

a storage element disposed in the backside interconnect structure;

a backside contact extending from a bottom surface of the drain feature, through the backside dielectric layer, to engage the storage element; and a liner extending continuously and conformally along a bottom surface of the source feature, a bottom surface of the gate structure, and a sidewall of the backside contact, wherein the liner interfaces the bottom surface of the gate structure.

19. The semiconductor structure of claim 18, wherein the liner comprises silicon nitride.

20. The semiconductor structure of claim 18, wherein the frontside interconnect structure is coupled to the source feature by way of a frontside source contact and a source contact via disposed over the frontside source contact, wherein a silicide feature is sandwiched between the frontside source contact and the source feature.

* * * * *